United States Patent [19]

Maekawa et al.

[11] Patent Number: 4,795,907
[45] Date of Patent: Jan. 3, 1989

[54] INFRARED DETECTOR

[75] Inventors: Tohru Maekawa, Kawasaki; Satoshi Ueda, Atsugi; Hiroshi Takigawa, Kawasaki; Tetsuya Kochi, Isehara; Junjiro Goto, Takasago, all of Japan

[73] Assignee: Fujitsu Limited, Kawasaki, Japan

[21] Appl. No.: 11,536

[22] Filed: Feb. 6, 1987

[30] Foreign Application Priority Data

Feb. 7, 1986 [JP] Japan .................... 61-025019

[51] Int. Cl.⁴ .................... G02B 5/28; G01J 5/06
[52] U.S. Cl. .................... 250/352; 250/332; 250/349
[58] Field of Search .................... 350/1.7, 1.6; 250/352, 250/370 L, 370 G, 349, 332, 338 SE, 338 PY, 338 R, 338, 338.1, 338.3, 338.4

[56] References Cited

U.S. PATENT DOCUMENTS

| 4,420,688 | 12/1983 | Le Bars | 250/352 |
| 4,446,372 | 5/1984 | Gurnee | 250/334 |
| 4,643,518 | 2/1987 | Taniguchi | 350/6.8 |
| 4,675,525 | 6/1987 | Amingual et al. | 250/338 SE |

FOREIGN PATENT DOCUMENTS 2912943 10/1979 Fed. Rep. of Germany ....... 350/1.7

Primary Examiner—Janice A. Howell
Assistant Examiner—Constantine Hannaher
Attorney, Agent, or Firm—Staas & Halsey

[57] ABSTRACT

An infrared radiation (IR) detector includes a cold shield consisting of (a) a light shielding portion having a substrate made of an infrared transmissive material, an infrared absorbing layer formed on one surface of the substrate, a dielectric layer formed on the infrared absorbing layer and an infrared reflecting layer formed on the dielectric layer, and (b) an opening portion consisting of a substrate made of an infrared transmissive material and a dielectric layer formed on the one surface of the substrate. The substrate and the dielectric layer are connected and generally continuous between the light shielding portion and the opening portion. The IR detector also includes an infrared detector array having a detective area arranged just below the opening portion of the cold shield.

9 Claims, 3 Drawing Sheets

INFRARED DETECTOR

BACKGROUND OF THE INVENTION

1. Field of the Invention

The present invention relates to an infrared detector, more particularly, it relates to a structure of a cold shield for infrared detector arrays.

2. Description of the Related Art

Infrared images are detected by a infrared detector of an imaging system. The infrared detector comprises an infrared detector array and an infrared shielding device, which absorbs infrared radiation and is fully cooled so that the shielding device does not become an infrared emitting source. Since the infrared shielding device is cooled, it is known as a cold shield.

The cold shield excludes unnecessary and undesired infrared radiation, and necessary and desired infrared radiation to be detected is allowed to pass through the cold shield, whereby the infrared images to be detected are accurately detected by the detector array. Conventionally, however, the infrared radiation reflected by an electrode on the detector element in an array is reflected by optical parts and then sometimes impinges to the detective area. Thus the detecting accuracy for the infrared radiation was lowered. This phenomenon is known as optical crosstalk.

SUMMARY OF THE INVENTION

Therefore, the object of the present invention is to provide an infrared detector of an imaging system wherein an infrared image can be accurately detected.

Another object of the present invention is to provide an infrared detector having a cold shield wherein infrared radiation absorbed in the cold shield is not emitted therefrom.

A further object of the present invention is to provide an infrared detector having openings in a cold shield, through which openings only necessary and desired infrared radiation is allowed to pass.

According to the present invention there is provided an infrared detector comprising a cold shield consisting of (a) and (b) portions, said (a) light shielding portion consisting of a substrate made of an infrared transmissive material, an infrared absorbing layer being formed on a first surface of the substrate, a dielectric layer being formed on the infrared absorbing layer and an infrared reflecting layer being formed on the dielectric layer, and said (b) portion being an opening in said cold shield consisting of the substrate made of an infrared transmissive material and said dielectric layer formed on the first surface of the substrate; and an infrared detector element having a detective area arranged just below said opening portion of said cold shield.

BRIEF DESCRIPTION OF THE DRAWINGS

The feature of the present invention will become clearer from the ensuring description of preferred embodiments made in reference to the accompanying figures, in which.

DESCRIPTION OF THE PREFERRED EMBODIMENTS

Before describing the present invention the related art will be explained in detail.

Figure 1:
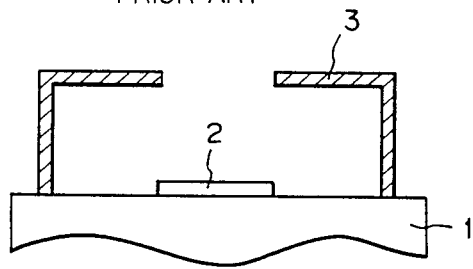
FIG. 1 is a schematic cross-sectional view of a conventional infrared detector.

FIG. 1 is a schematic cross-sectional view of a conventional infrared radiation (IR) detector. An IR detector array 2, which detects an infrared image, is provided on a cold stage 1 which is cooled by, for example, liquid nitrogen. Further, a cold shield 3 is also provided on the cold stage 1 so that unnecessary and undesired IR is shielded, and necessary and desired infrared rays are passed therethrough to the IR to the detector array 2.

The cold shield 3 is made of aluminum having, for example, a black surface. The cold shield 3 absorbs the IR and is fully cooled by a cooling device (not shown) at the cold stage 1 so that the cold shield 3 does not become an IR emitting source.

Thus, the cold shield 3 excludes unnecessary and undesired IR. On the other hand, the desired IR is passed through an opening of the cold shield 3 to the detector array 2 and an accurate detection of the IR is obtained.

Figure 2:
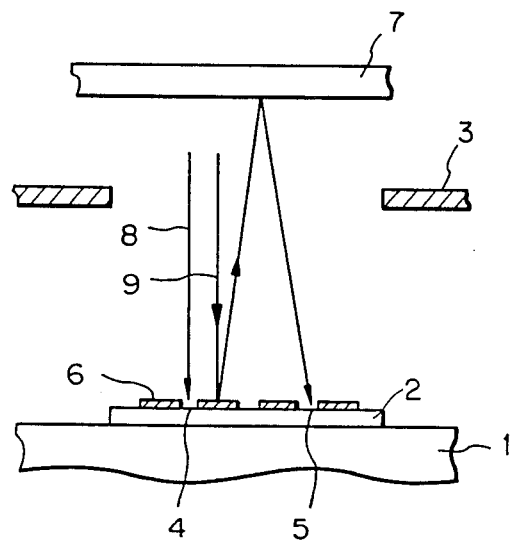
FIG. 2 is a partially enlarged cross-sectional view of FIG. 1.

As shown in FIG. 2, an infrared ray 8 directly impinges on a detective area 4, and IR allowed to impinge on the detector array 2 through a window 7 are detected by the detective area 4. However, an infrared ray 9 impinges on one of several electrodes 6 and is reflected by the electrode 6 so that the reflected infrared ray 9 is reflected by the window 7, etc., and often impinges on, for example, a detective area 5, whereby the accuracy of the infrared detection is lowered.

Figure 3:
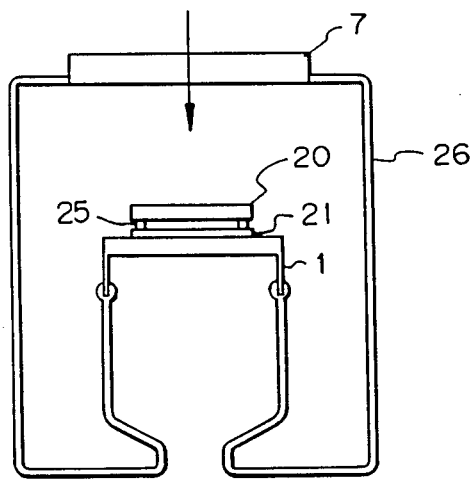
FIG. 3 is a schematic cross-sectional view of an example according to the present invention.

FIG. 3 shows a schematic cross-sectional view of an example according to the present invention.

As shown in FIG. 3 an infrared detector comprising a cold shield 20 and infrared detector array 21 is provided on the cold stage 1, and spacers 25 are arranged between the cold shield 20 and the infrared detector array 21. A window 7, through which IR is allowed to pass to impinge on the infrared detector, is set in a dewar 26 and is faces the infrared detector.

Figure 4:
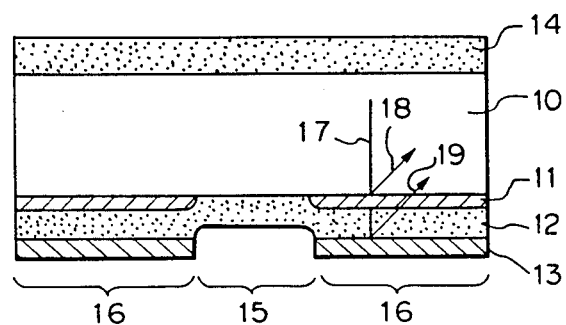
FIG. 4 is a cross-sectional view of a cold shield of FIG. 3.

The cold shield portion shown in FIG. 3 will be explained with reference to FIG. 4.

A light shielding portion 16 of the cold shield 20 consists of five layers; i.e., a dielectric layer 14, a substrate 10, an infrared absorbing layer 11 formed on one surface of the substrate 10, a dielectric layer 12 formed on the infrared absorbing layer 11 and a infrared reflecting layer 13 formed on the dielectric layer 12. The substrate 10 is made of an infrared transmissive material, for example, ZnS, ZnSe, and Ge, etc., and the infrared absorbing layer 11 is made of, for example, Cr or Ni, etc. The dielectric layer is made of, for example, $CeF_3$ or $PbF_2$ etc. The infrared reflecting layer 13 is made of a metal such as Al or Au, etc.

The light shielding portion 16 of the cold shield 20 efficiently eliminates IR by absorbing and interfering with IR which impinges on the portion 16.

The present invention is effective even without the dielectric layer 14.

An opening portion 15 of the cold shield 20 consists of three layers, i.e., the dielectric layer 14, the substrate 10, and the dielectric layer 12.

IR impinging thereon from above is efficiently passed through the opening portion 15 of the cold shield 20, so that the IR is led to a detective area (not shown).

The effects of the example of the present invention will be explained.

Since the opening portion 15 of the cold shield 20 is formed by the substrate 10 made of an infrared transmissive material and the dielectric layer 12, which have a proper refractive index to get a good optical transmissive property, the IR impinging on the opening portion 15 can be efficiently led to a detective area.

The wave length of the IR impinging on the opening portion is assumed to be $\lambda$ and the refractive indexes of the substrate 10 and the dielectric layers 12 and 14 are assumed to be n1 and n3, respectively. Further, the thickness of the dielectric layer is assumed to be d1. As is well known, when the expressions $n3 = \sqrt{n1}$ and $n3 \times d1 = \lambda/4$ are satisfied, the optimum transmittance is realized. Therefore, most of IR impinging on an opening portion passes through the opening portion of a structure having such conditions and reaches a detective area.

Then, a part of the infrared ray 17 impinging on the light shielding portion 16 is reflected at the interface between the substrate 10 and the infrared absorbing layer 11, due to the difference between the refractive indexes n1 and n2 thereof (n2 being the refractive index of the infrared absorbing layer 11). A part of the infrared ray 17 reflected at the interface is shown as reference number 18.

A part of the remaining infrared ray 17, which is not reflected at the interface, is absorbed in the infrared absorbing layer 11 and the remains pass through the dielectric layer 12 to reach the infrared reflecting layer 13.

This remaining portion of the infrared ray 17 is reflected at the surface of the infrared reflecting layer 13 and passes through the dielectric layer 12 again. A part of the infrared ray 17 absorbed by the infrared absorbing layer 11, and the rest of the infrared ray is emitted from the infrared ray absorbing layer 11. The emitted infrared ray is shown as reference number 19.

By equalizing the intensity of the infrared rays 18 and 19, and at the same time reversing the phases therebetween, the infrared 18 and 19 are mutually cancelled and thus the emission of infrared from the light shielding portion 16 is prevented.

The regulation of the intensity of the infrared 18 and 19 can be carried out by the selection of the material and the thickness of the infrared absorbing layer 11. Further, the regulation of the phase difference between the infrared rays 18 and 19 can be carried out by the regulation of the thickness of the dielectric layer 12.

Particularly, when relationships n1<n2, n3<n4 or n1>n2, n3>n4 between refractive indexes of n1, n2, n3 and n4 of the substrate 10, the absorbing layer 11, the dielectric layer 12, and the reflecting layer 13 are satisfied, both phase reverse of infrared rays impinging on the infrared absorbing layer 11 and that of infrared rays impinging on the infrared reflecting layer 13 occur in the former condition and neither them occur in the later condition. Thus, the thickness of the dielectric layer 12, which gives rise to phase reverse between infrared rays 18 and 19, corresponds to the layer thickness d1 ($n3 \times d1 = \lambda/4$) having the optimum transmittance determined at the above-mentioned opening portion 15 of the cold shield 20. Thus, since the thickness of the dielectric layers 12 and 14 in the opening portion 15 and the light receiving portion 16 may be made the same thickness, the cold shield 20 can be produced advantageously.

When IR having a wavelength of 10 $\mu$m is to be detected, a dielectric layer of about 1.7 $\mu$m, which is calculated from the expression $n3 \times d1 = \lambda/4$, is used as the optimum infrared cancelling condition. In this case, for example, a substrate 10 of ZnS having a thickness of 200 to 500 $\mu$m, an absorbing layer 11 of Cr having a thickness of about 0.05 $\mu$m, and an absorbing layer 13 of Al having a thickness of about 1 $\mu$m, are used.

Figure 5:
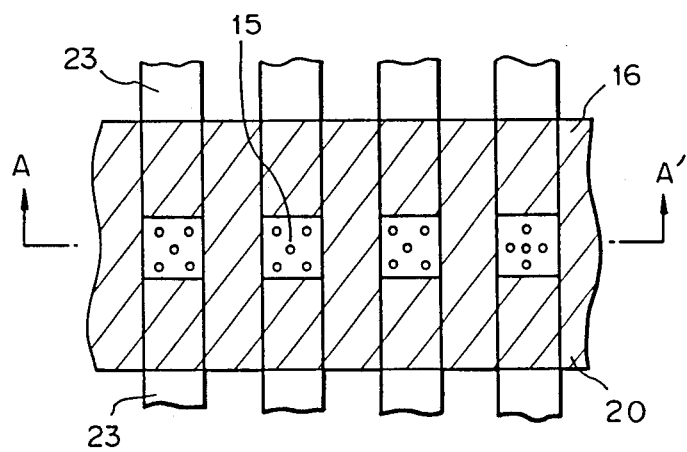
FIG. 5 is a plan view of a cold shield provided on a detector array according to the present invention.
Figure 6:
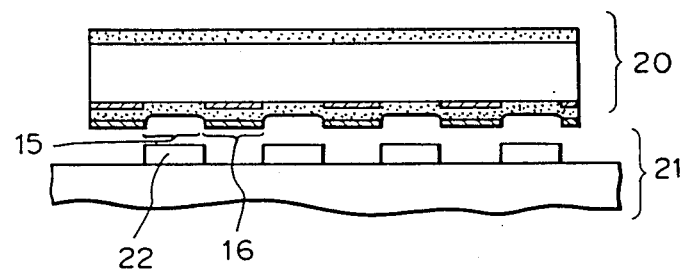
FIG. 6 is a cross-sectional view taken along a line A—A' of FIG. 5.

FIG. 5 shows a plan view of a cold shield provided on a detector array according to the present invention, and FIG. 6 shows a cross-sectional view taken along a line A—A' of FIG. 5.

As shown in FIG. 5 the light shielding portion 16 of the cold shield 20 shields all portions of the infrared detector array 21 except above the detective areas 22. The opening portions 15 of the cold shield 20 are provided just above each of the detective areas 22. Thus, IR impinging on the opening portions 15 only is led to the detective areas 22 just below the opening portions 15. On the other hand, since IR impinging on the light shielding portion 16 is eliminated by the absorbing effect and interference action of the light shielding portion 16, the disadvantage whereby undesired infrared reach another detective area because of reflection at the electrode 23, etc., as explained in the conventional art, does not occur.

We claim:

1. An infrared detector comprising:
   a cold shield including
      a light shielding portion comprising an infrared transmissive material substrate, an infrared absorbing layer formed on a first surface of the substrate, a first dielectric layer formed on the infrared absorbing layer and an infrared reflecting layer formed on the first dielectric layer, and
      opening portions comprising portions of said substrate and said first dielectric layer and
   an infrared detector array having detective areas arranged just below said opening portions of said cold shield,
   said infrared absorbing layer and said first dielectric layer being positioned so that infrared radiation reflected at a surface of the infrared absorbing layer and infrared radiation reflected at the infrared reflecting layer being mutually eliminated by optical interference effect.

2. An infrared detector according to claim 1, wherein a second dielectric layer is formed on a second surface of said substrate, opposite the first surface.

3. An infrared detector according to claim 1, wherein the following expressions are satisfied:

$$n3 = \sqrt{n1} \text{ and } n3 \times d1 = \lambda/4$$

where $\lambda$ is a wavelength of desired infrared radiation, n1 is a refractive index of said substrate, n3 is a refractive index of said first dielectric layer and d1 is a thickness of said first dielectric layer.

4. An infrared detector according to claim 1, wherein a refractive index of the first dielectric layer for infrared radiation is smaller than a refractive index of the substrate, and larger than 1.

5. An infrared ray detector according to claim 1, wherein the infrared absorbing layer is made of Cr or Ni.

6. An infrared detector according to claim 1, wherein the first dielectric layer is made of $CeF_3$ or $PbF_2$.

7. An infrared detector according to claim 1, wherein said first dielectric layer is continuous between said light shielding portion and said opening poritons.

8. An infrared detector comprising:
 a cold shield including
  an infrared transmissive substrate,
  an infrared absorbing layer formed on spaced apart portions of a first surface of said substrate so as to define first areas of said substrate,
  a first dielectric layer formed on said infrared absorbing layer and on said subtrate, and
  an infrared reflecting layer formed on portions of said first dielectric layer opposing said infrared absorbing layer; and
 an infrared detector array having detective areas positioned opposite said first areas and opposing said infrared reflecting layer.

9. An infrared detector according to claim 8, wherein a second dielectric layer is formed on a second surface of the substrate.

* * * * *